(12) United States Patent
Levy et al.

(10) Patent No.: US 8,188,570 B2
(45) Date of Patent: May 29, 2012

(54) STRUCTURE AND METHOD FOR BURIED INDUCTORS FOR ULTRA-HIGH RESISTIVITY WAFERS FOR SOI/RF SIGE APPLICATIONS

(75) Inventors: Max G. Levy, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/875,398

(22) Filed: Sep. 3, 2010

(65) Prior Publication Data
US 2010/0327398 A1 Dec. 30, 2010

Related U.S. Application Data

(62) Division of application No. 12/122,754, filed on May 19, 2008, now Pat. No. 7,842,580.

(51) Int. Cl.
*H01L 27/08* (2006.01)
(52) U.S. Cl. ............... 257/531; 438/385; 257/E21.022
(58) Field of Classification Search .................. 257/531, 257/E21.022; 438/385
See application file for complete search history.

(56) References Cited

U.S. PATENT DOCUMENTS

| | | | |
|---|---|---|---|
| 6,646,534 B2 | 11/2003 | Ahn et al. | |
| 6,701,607 B2 | 3/2004 | Ahn et al. | |
| 6,760,967 B2 | 7/2004 | Ahn et al. | |
| 6,817,087 B2 | 11/2004 | Ahn et al. | |
| 6,822,545 B2 | 11/2004 | Ahn et al. | |
| 6,825,747 B2 | 11/2004 | Ahn et al. | |
| 6,850,141 B2 | 2/2005 | Ahn et al. | |
| 6,853,288 B2 | 2/2005 | Ahn et al. | |
| 6,900,716 B2 | 5/2005 | Ahn et al. | |
| 6,910,260 B2 | 6/2005 | Ahn et al. | |
| 6,927,666 B2 | 8/2005 | Ahn et al. | |
| 6,946,389 B2 | 9/2005 | Farrar et al. | |
| 6,948,230 B2 | 9/2005 | Ahn et al. | |
| 7,158,004 B2 | 1/2007 | Ahn et al. | |
| 7,164,188 B2 | 1/2007 | Farrar et al. | |

FOREIGN PATENT DOCUMENTS

| | | |
|---|---|---|
| JP | 63048809 | 3/1988 |
| KR | 2090643 | 5/2001 |
| KR | 3055485 | 12/2001 |

OTHER PUBLICATIONS

"Electrical Properties of Silicon", website showing resistivity of doped silicon, 7 pages (date unknown).*

* cited by examiner

*Primary Examiner* — Matthew Landau
*Assistant Examiner* — Sonya McCall Shepard
(74) *Attorney, Agent, or Firm* — Anthony Canale; Roberts Mlotkowski Safran & Cole, P.C.

(57) ABSTRACT

A design structure is embodied in a machine readable medium for designing, manufacturing, or testing a design. The design structure includes a high resistivity substrate and a buried inductor formed directly in the high resistivity substrate and devoid of an insulating layer therebetween.

20 Claims, 21 Drawing Sheets

STRUCTURE AND METHOD FOR BURIED INDUCTORS FOR ULTRA-HIGH RESISTIVITY WAFERS FOR SOI/RF SIGE APPLICATIONS

CROSS REFERENCE TO RELATED APPLICATIONS

The present application claims domestic priority as a divisional application of U.S. patent application Ser. No. 12/122,754, filed on May 19, 2008, now U.S. Pat. No. 7,842,580, the disclosure of which is expressly incorporated by reference herein in its entirety.

FIELD OF THE INVENTION

The present invention generally relates to a design structure and method of manufacturing a circuit, and more specifically to a design structure and method for buried inductors for ultra-high resistivity wafers for silicon on insulator (SOI) radio frequency (RF) silicon germanium (SiGe) applications.

BACKGROUND

Passive elements are needed in RF SOI and RF power amp applications. Inductors may be formed in a substrate, for example, to enable designers to integrate high-Q resonant circuits in support of, e.g., low-phase-noise voltage-controlled oscillators (VCOs), narrow-band filters, and low-loss impedance matching. More specifically, a trench may be formed in a substrate and a conducting material, for example, may be deposited in the trench to form the inductor. Conventionally, a substrate may have a resistance on the order of two to twenty Ohm-cm. Thus, an additional insulator layer or film is formed in the trench between the substrate and the inductor to insulate the inductor from the substrate. The formation of the insulating layer is an additional process that adds to the costs of the manufactured device.

Devices in advanced microelectronics employ silicon-on-insulator (SOI) technology for improved performance, where the active area of a device is in a thin silicon layer, isolated from the bulk silicon substrate by a buried oxide (BOX) layer. The BOX layer provides electrical isolation from the substrate for improved field distribution in the active area. The implementation of SOI technology is one of several manufacturing strategies employed to allow the continued miniaturization of microelectronic devices.

SOI technology utilizes ultra high resistivity wafers, having a resistance, for example, from one to ten k-Ohm. However, known methods and devices having buried inductors include an insulating layer between the buried inductor and the ultra high resistivity wafer, and do not fully utilize the SOI ultra high resistivity wafers' properties.

Accordingly, there exists a need in the art to overcome the deficiencies and limitations described hereinabove.

SUMMARY

In a first aspect of the invention, a structure comprises a high resistivity substrate and a buried inductor formed directly in the high resistivity substrate and devoid of an insulating layer therebetween.

In an additional aspect of the invention, a method comprises forming a high resistivity substrate and forming a buried inductor comprising a conductive coil having an inner end and an outer end directly in the high resistivity substrate, which is devoid of an insulator layer therebetween.

In a further aspect of the invention, a design structure is embodied in a machine readable medium for designing, manufacturing, or testing an integrated circuit. The design structure comprises a high resistivity substrate and a buried inductor formed directly in the high resistivity substrate and devoid of an insulating layer therebetween.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to a design structure and method of manufacturing a circuit, and more specifically to a design structure and method for buried inductors for ultra-high resistivity wafers for silicon on insulator (SOI) radio frequency (RF) silicon germanium (SiGe) applications. According to an aspect of the invention, buried inductors are formed in an SOI substrate without using an insulation layer between the buried inductors and the SOI substrate. Rather, the buried inductors are insulated from the substrate relying on the ultra-high resistivity properties of the SOI substrate. By implementing the invention, a formation process for a device containing buried inductors is simplified and, consequently, the formation process and the formed device are less costly and time consuming.

In embodiments, a deep trench buried inductor may be formed in the SOI substrate. More specifically, deep trenches may be formed through the SOI substrate, as discussed further below, and buried inductors may be formed in the trenches through the silicon layer, BOX layer and/or the Si substrate. The buried inductor may be formed of a doped polysilicon or a metal, e.g., tungsten. As discussed further below, due to temperature considerations, an inductor may be formed of a doped polysilicon earlier in the process, e.g., a front end of line (FEOL) process, whereas an inductor may be formed of a metal later in the process, e.g., a back end of line (BEOL) process.

The quality factor (or Q) of an inductor is the ratio of its inductive resistance to its resistance at a given frequency, and is a measure of the inductor's efficiency. The higher the Q factor of the inductor, the closer the inductor approaches the behavior of an ideal, lossless inductor. As should be understood, a metal inductor will exhibit a higher Q factor.

Device Formation Process

Figure 1:
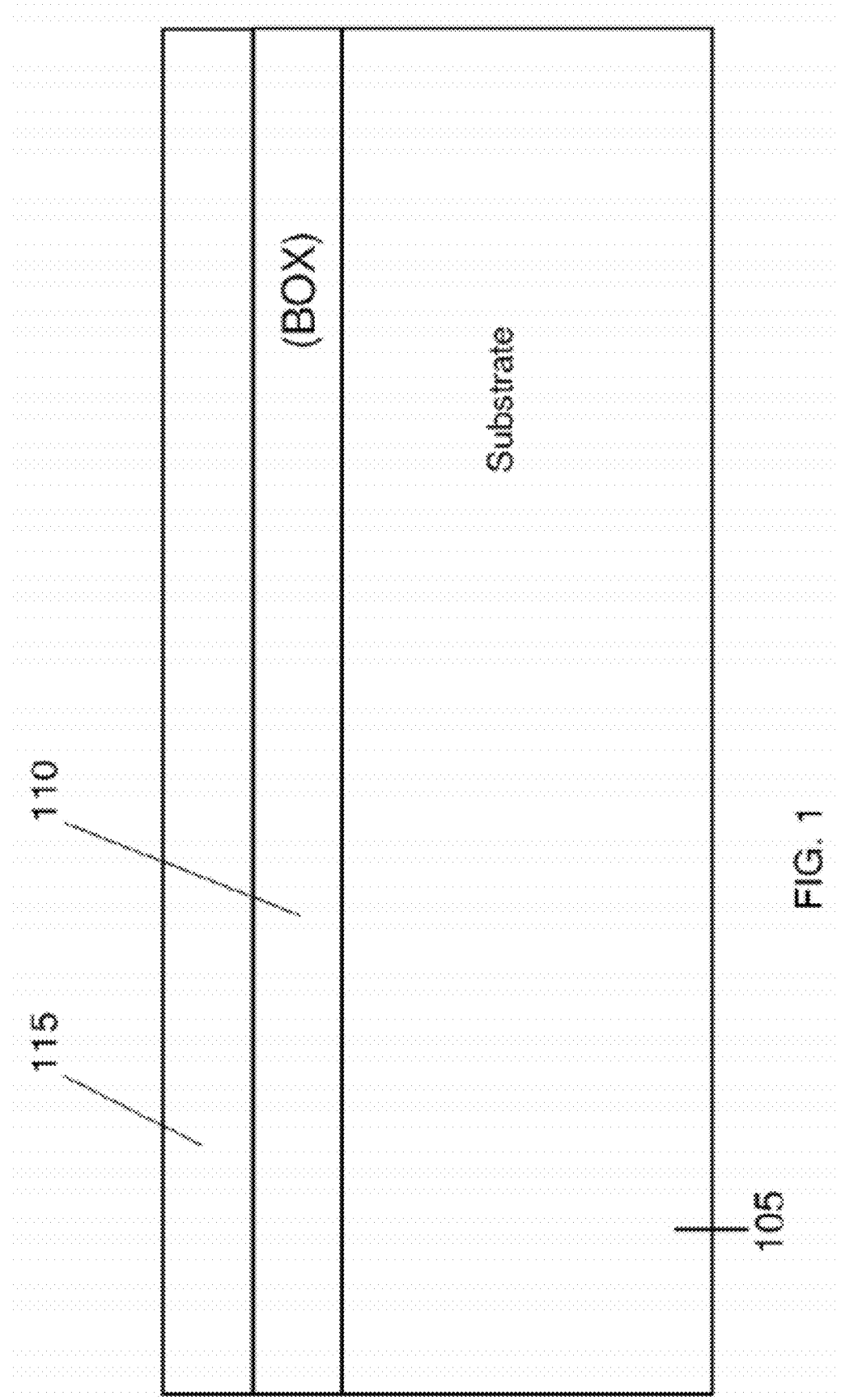
FIGS. 1-4 show intermediate process steps and structures in accordance with a first aspect of the invention.
Figure 3:
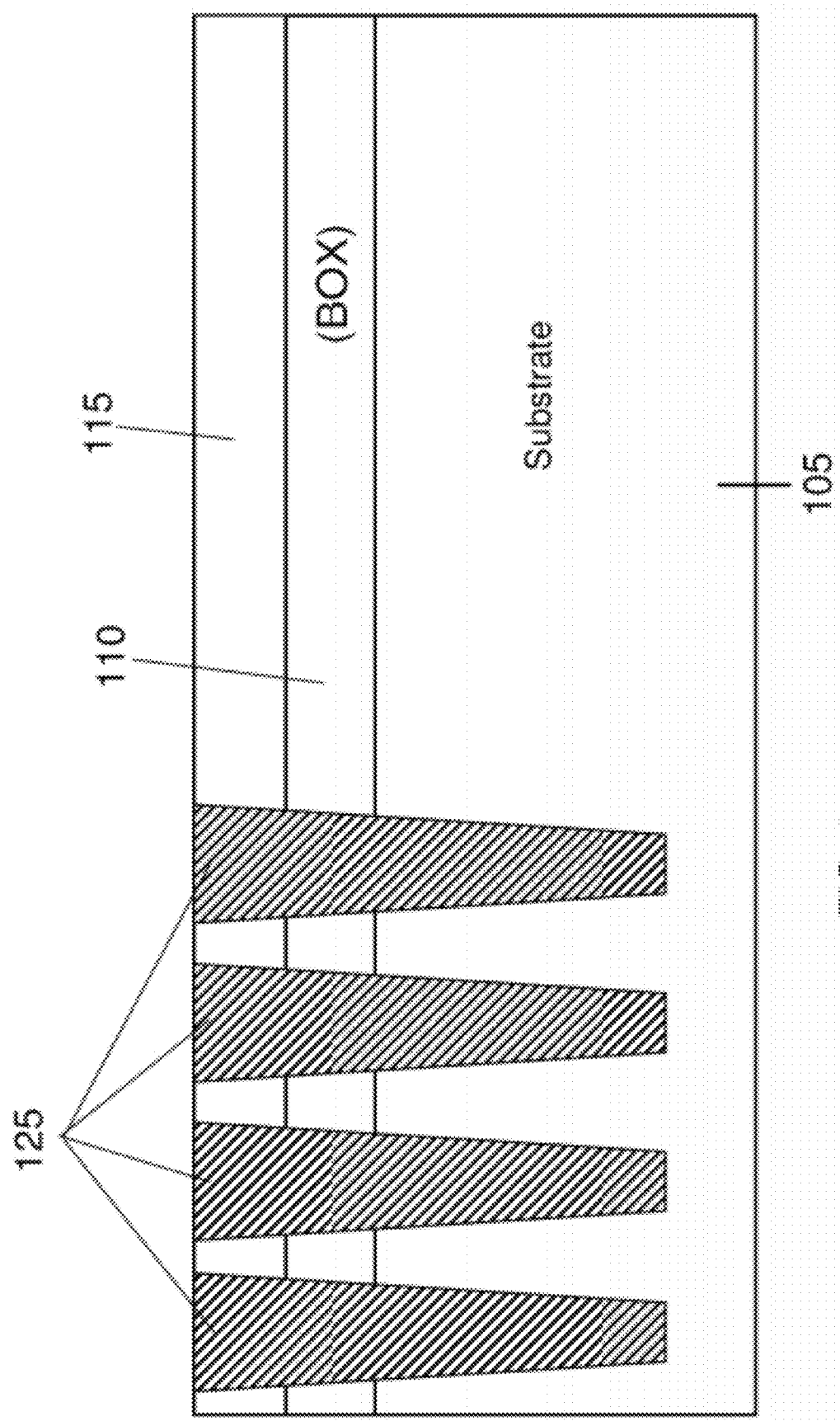
Figure 4:
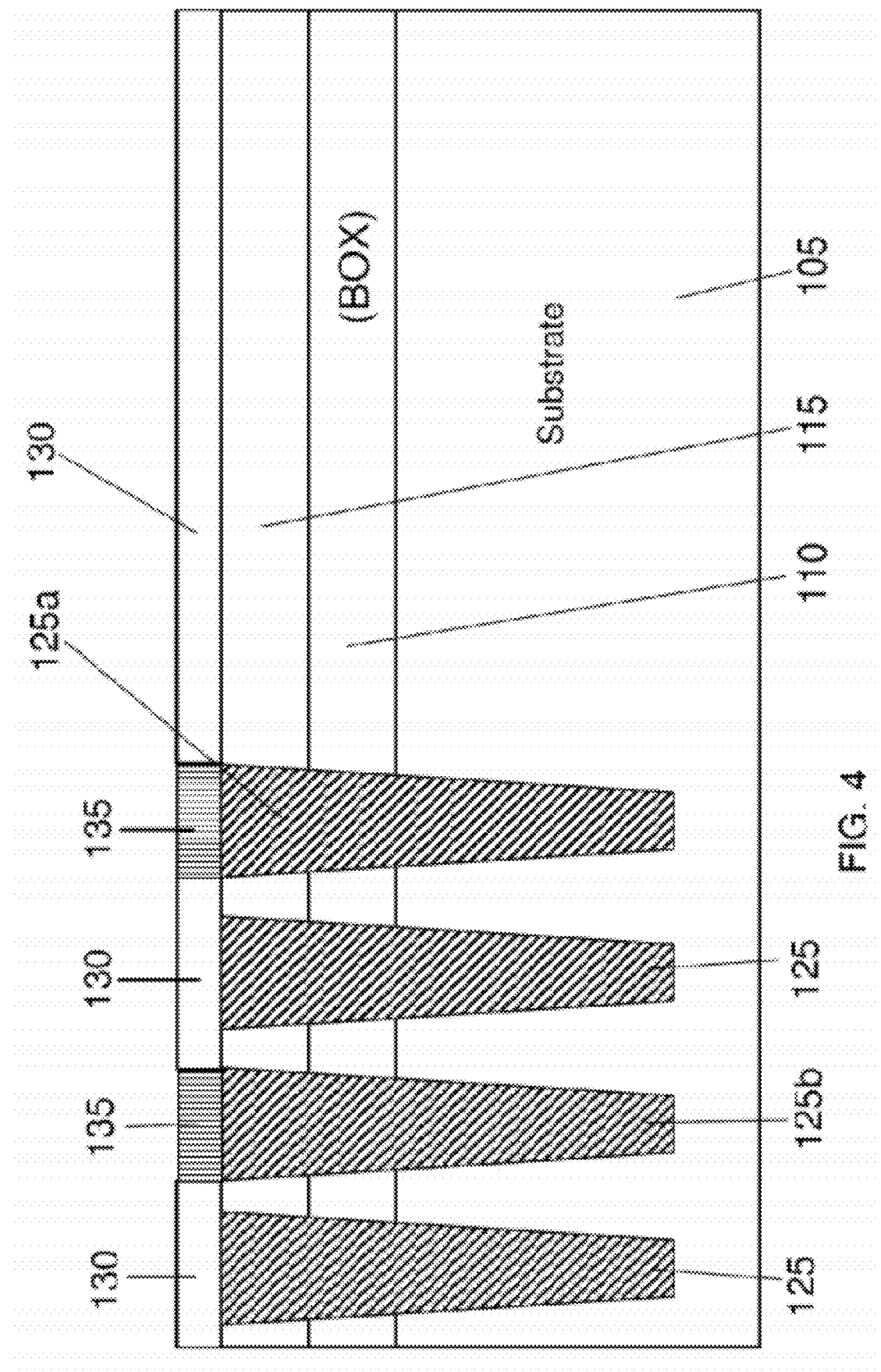
Figure 5:
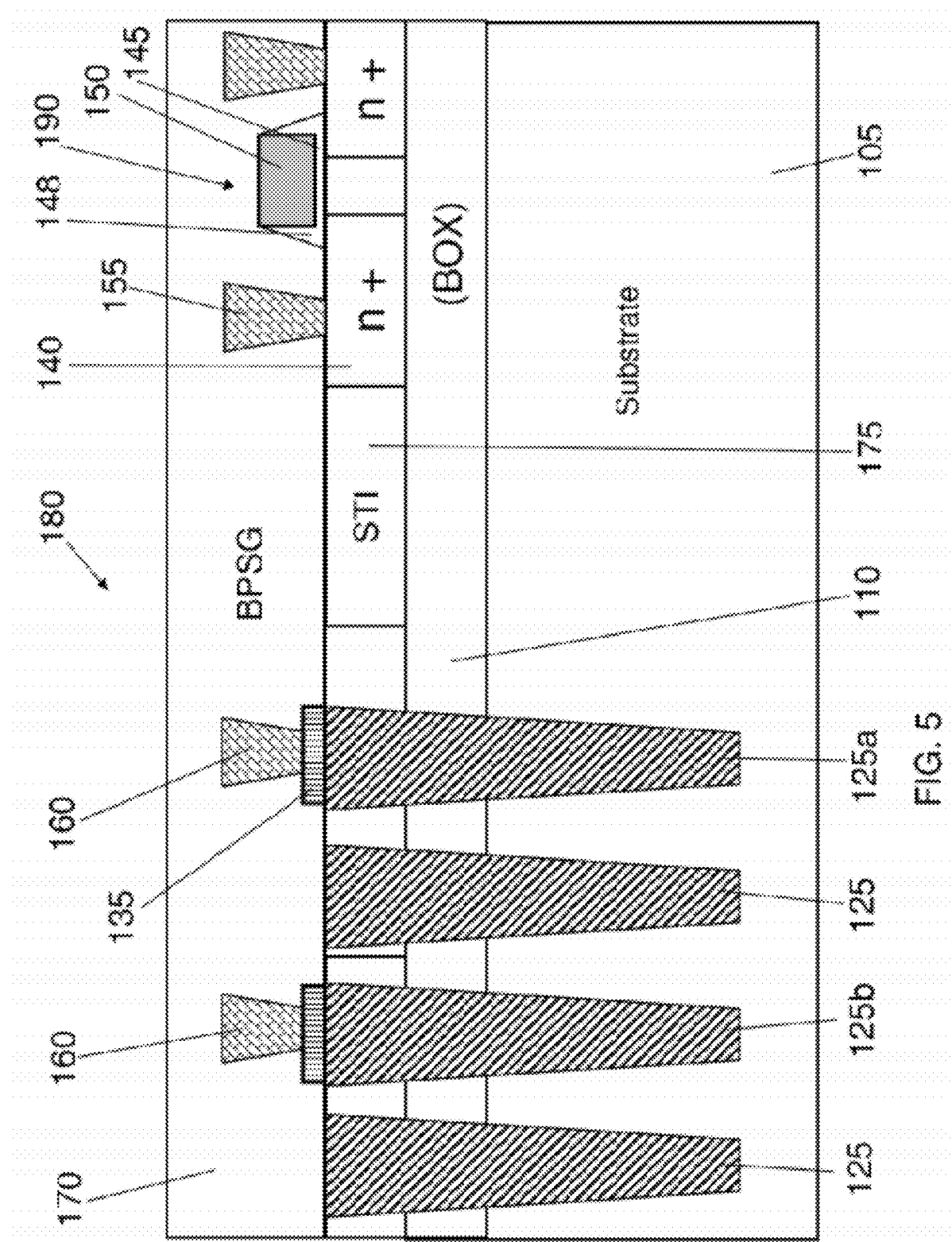
FIG. 5 shows final process steps and a structure in accordance with a first aspect of the invention.

FIGS. 1-4 show process steps for forming an exemplary integrated circuit device containing doped poly silicon deep trench buried inductors shown in FIG. 5, according to a first embodiment of the invention. As shown in FIG. 1, a SOI substrate includes a silicon layer 115 formed on a buried oxide (BOX) layer 110. Additionally, the BOX layer 110 is conventionally formed on or within an Si substrate 105. The Si substrate 105 is doped very low, e.g., with a P-type dopant, e.g., $BF_2$, to impart high resistivity to the Si substrate 105. For example, the dopant dosage may be on the order of approximately 5e12-5e15 $cm^{-3}$.

Figure 2:
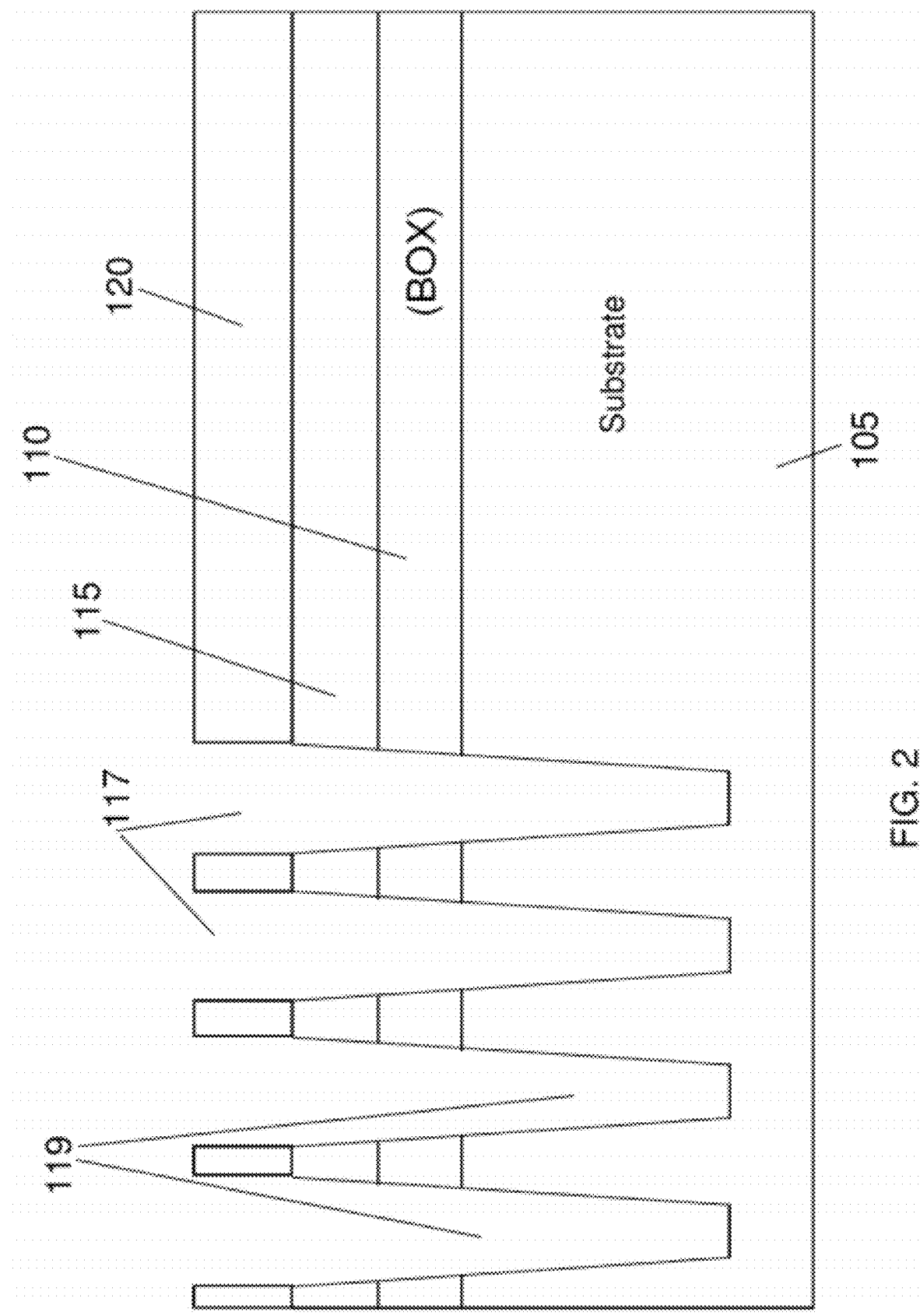

FIG. 2 shows the structure after further processing steps. As shown in FIG. 2, a mask layer 120 is formed on the silicon layer 115 having windows 117 selectively formed according to a conventional lithography process. For example, a photomask is exposed to a light source in order to form the windows 117. Trenches 119 are etched through the silicon layer 115, the BOX layer 110 and into the substrate 105 according to a conventional etching process (e.g., a reactive ion etch (RIE)). In embodiments, the trenches may be etched to a depth of many microns. More specifically, the depth of the etching may be limited by the masking material used. Additionally, it should be understood that increased depth of the trench allows for a buried inductor of increased surface area, thus providing the buried inductor with increased inductive properties As shown in FIG. 3, the mask layer 120 may be stripped and material for deep trench buried inductors 125 may be deposited in the trenches 119. Generally, buried inductors may be formed of a doped poly silicon or a metal, e.g., tungsten. As discussed further below, due to process temperature considerations, an inductor may be formed of a doped polysilicon earlier in the process, e.g., a front end of line (FEOL) process, whereas an inductor may be formed of a metal or a doped polysilicon later in the process, e.g., a back end of line (BEOL) process.

With the embodiment shown in FIGS. 1-5, the buried inductors 125 may be formed of a doped polysilicon during a FEOL process through a conventional polysilicon deposition process. In embodiments, the polysilicon inductors may be doped with a doping concentration on the order of approximately 1e20-5 e20 $cm^{-3}$. Additionally, the buried inductors 125 may be planarized using a conventional polishing process. As such, a description of the deposition and planarization processes are not necessary for a person of ordinary skill in the art to practice these particular steps.

As shown in FIG. 4, in embodiments, a contact mask 130 may be formed on the structure using a conventional lithography process, and optionally, a SiGe layer or silicide film 135 may be deposited on an upper surface of and in contact with the inner end 125a and outer end 125b of the buried inductors 125 through openings in the contact mask layer 130 using a conventional deposition process. Additionally, the SiGe layer or silicide film 135 may be planarized using a conventional polishing process. As such, a description of the lithography, deposition and planarization processes are not necessary for a person of ordinary skill in the art to practice these particular steps. According to an aspect of the invention, the SiGe layer or silicide film 135 may improve contact to the buried inductors 125.

FIG. 5 shows a final structure 180 containing deep a trench buried inductor 125 after further processing steps according to an embodiment of the invention. As shown in FIG. 5, a shallow trench isolation (STI) 175 may be formed using a mask to expose a selective region of the silicon layer 115, followed by an etch, e.g., a RIE, to form a trench and a deposition of a dielectric, e.g., $SiO_2$, in the trench. Additionally, a gate dielectric layer 145, e.g., a gate oxide and sidewalls and a gate 150 may be formed in a conventional manner through deposition and etching processes. By way of one non-limiting illustration, a gate dielectric layer 145 such as, for example, silicon oxide, silicon nitride, silicon oxynitride, high-k material, or any combination of these materials, is deposited on the silicon layer 115. Although not critical to the understanding of the invention, the gate dielectric material can range in thickness from about 10 Å to 200 Å. A gate material 150 is deposited on the gate dielectric layer 145. The gate material 150 can be polysilicon, a metal (e.g., titanium), a metal alloy (e.g., titanium nitride, tantalum nitride, tungsten silicide, titanium silicide, cobalt silicide, nickel silicide), or any combination of those materials. A cap material (e.g., nitride) (not shown) may be deposited on the gate material 150. In subsequent processes, the gate materials 145, 150 and the cap material are patterned using conventional processes, e.g., lithography and etching, to form the gate structure of the NFET 190. Sidewalls 148 can be formed on sides of the gate material 150 in a conventional deposition process. Further, source and drain regions 140 for an active device may be formed on the silicon layer 115 using a mask formed on the silicon layer 115 to expose the source and drain regions 140 followed by a conventional doping process of a n-type dopant, e.g., As, using, for example, an ion implantation process.

Additionally, as shown in FIG. 5, N+ contacts 155 may be formed on the N+ source and drain regions 140 in a conventional manner. Additionally, buried inductor contacts 160 may be formed on the inner end 125a and the outer end 125b of the buried inductors 125 (or on the optional SiGe layer or silicide film 135 formed on the inner end 125a and the outer end 125b of the buried inductors 125) in a conventional manner. Further, as shown in FIG. 5, a borophosphosilicate glass (BPSG) layer 170 may be deposited over the N+ contacts 155, the gate structure 150 and the buried inductor contacts 160 and planarized in a conventional manner, e.g., a chemical-mechanical polish (CMP) process. As shown in FIG. 5, according to an aspect of the invention, the buried inductor 125 may be formed in the high resistivity substrate 105 without any insulator layer between the buried inductor 125 and the high resistivity substrate 105.

Figure 6:
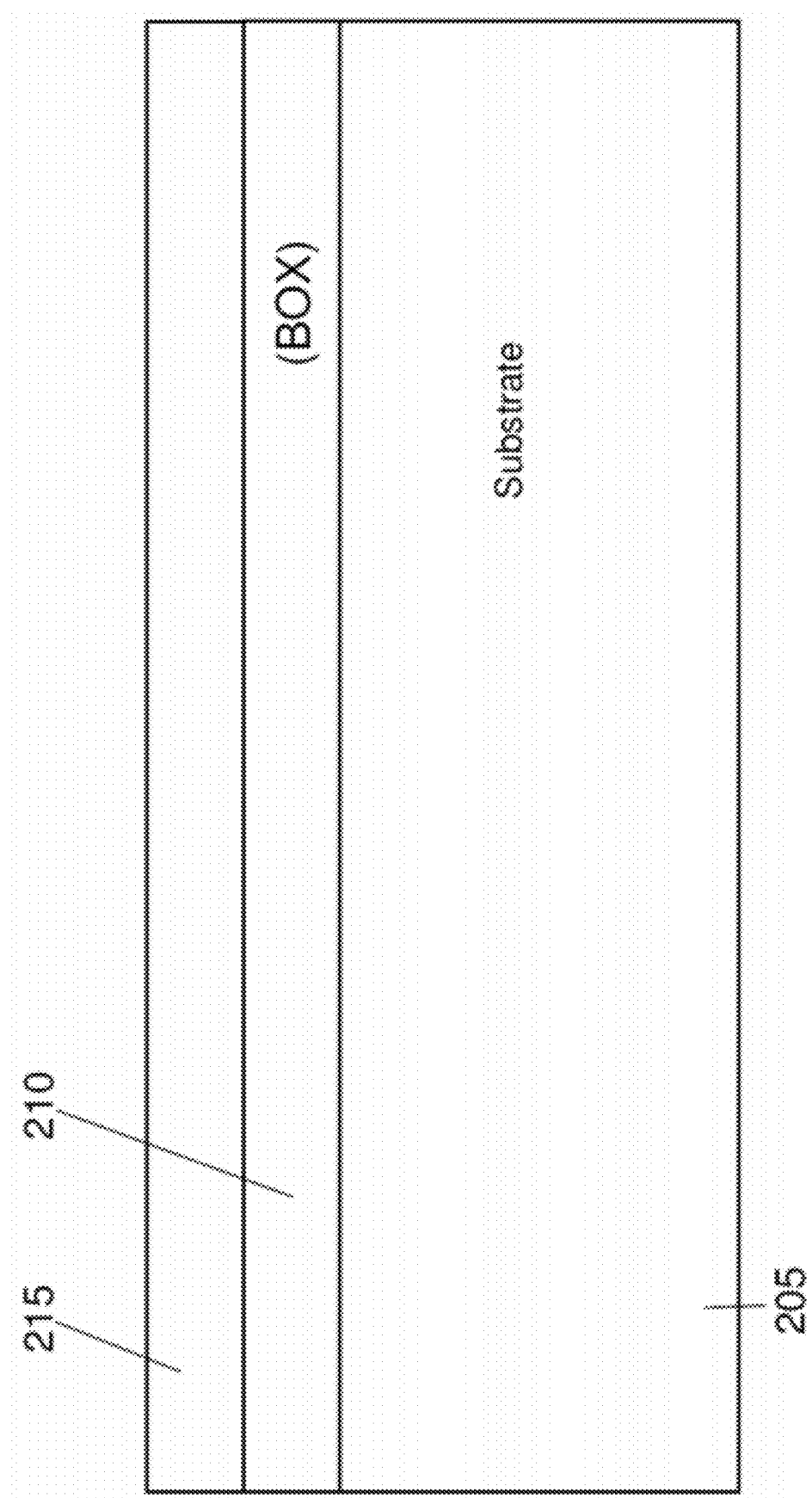
FIGS. 6-10 show intermediate process steps and structures in accordance with a second aspect of the invention.
Figure 9:
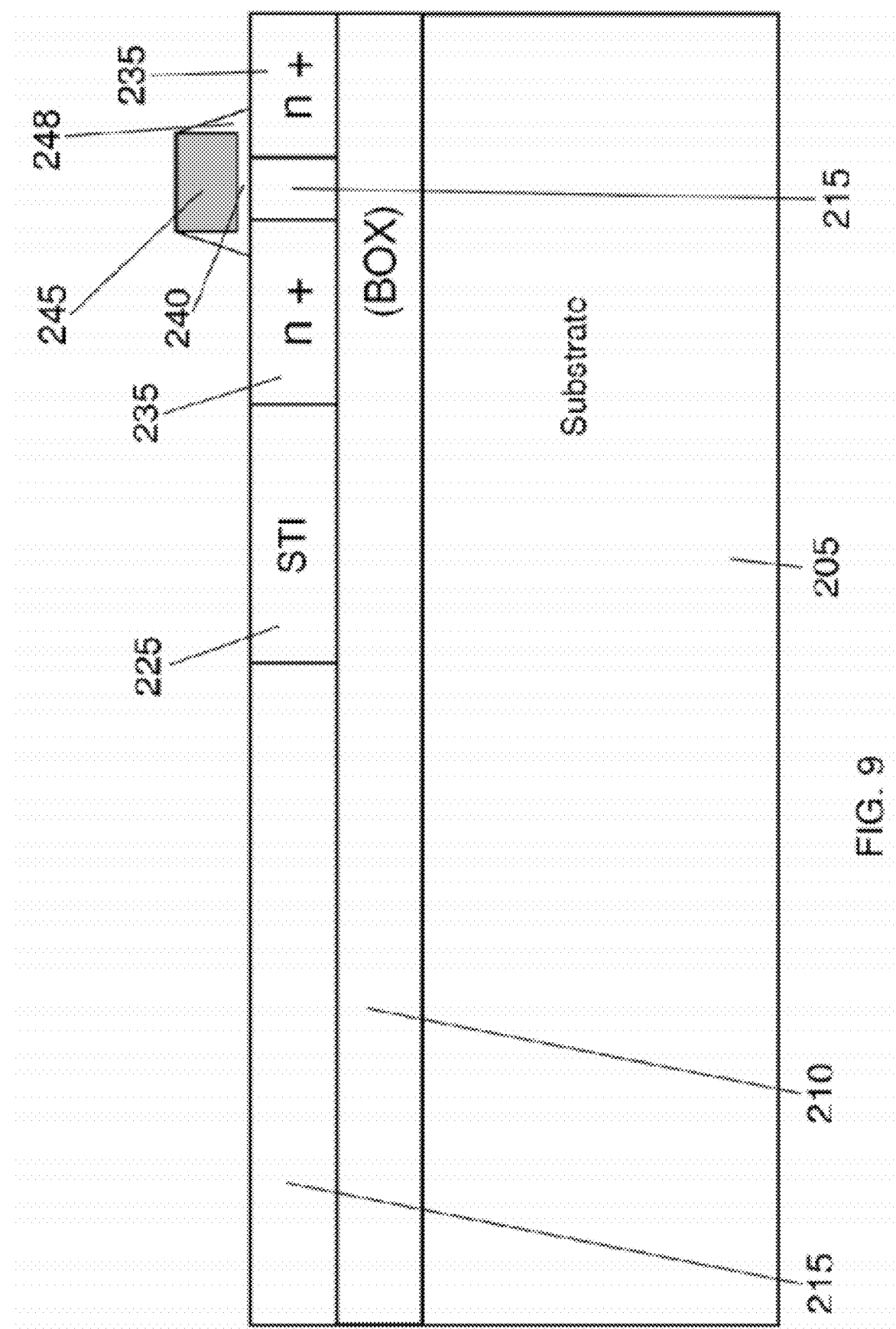
Figure 10:
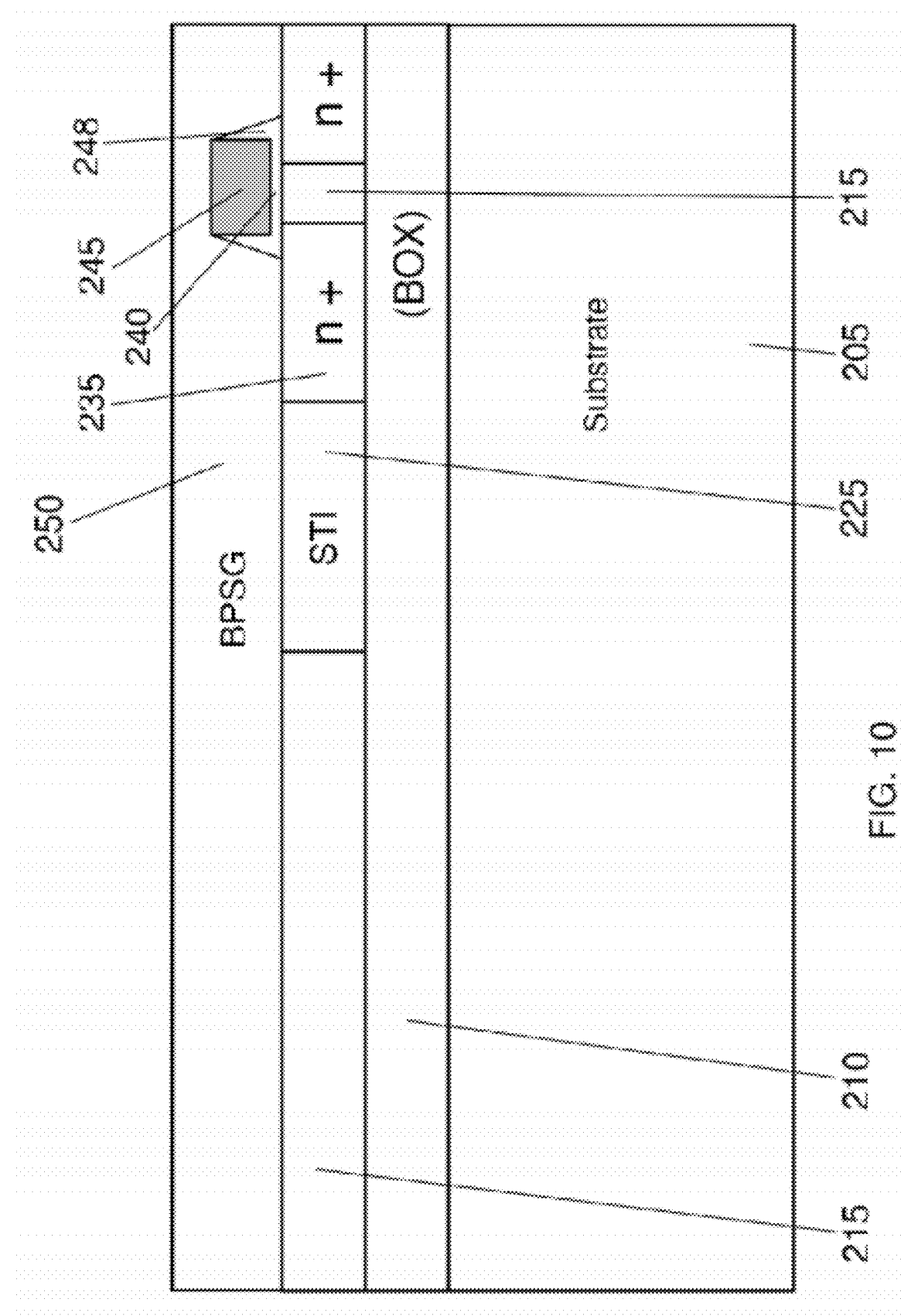
Figure 11:
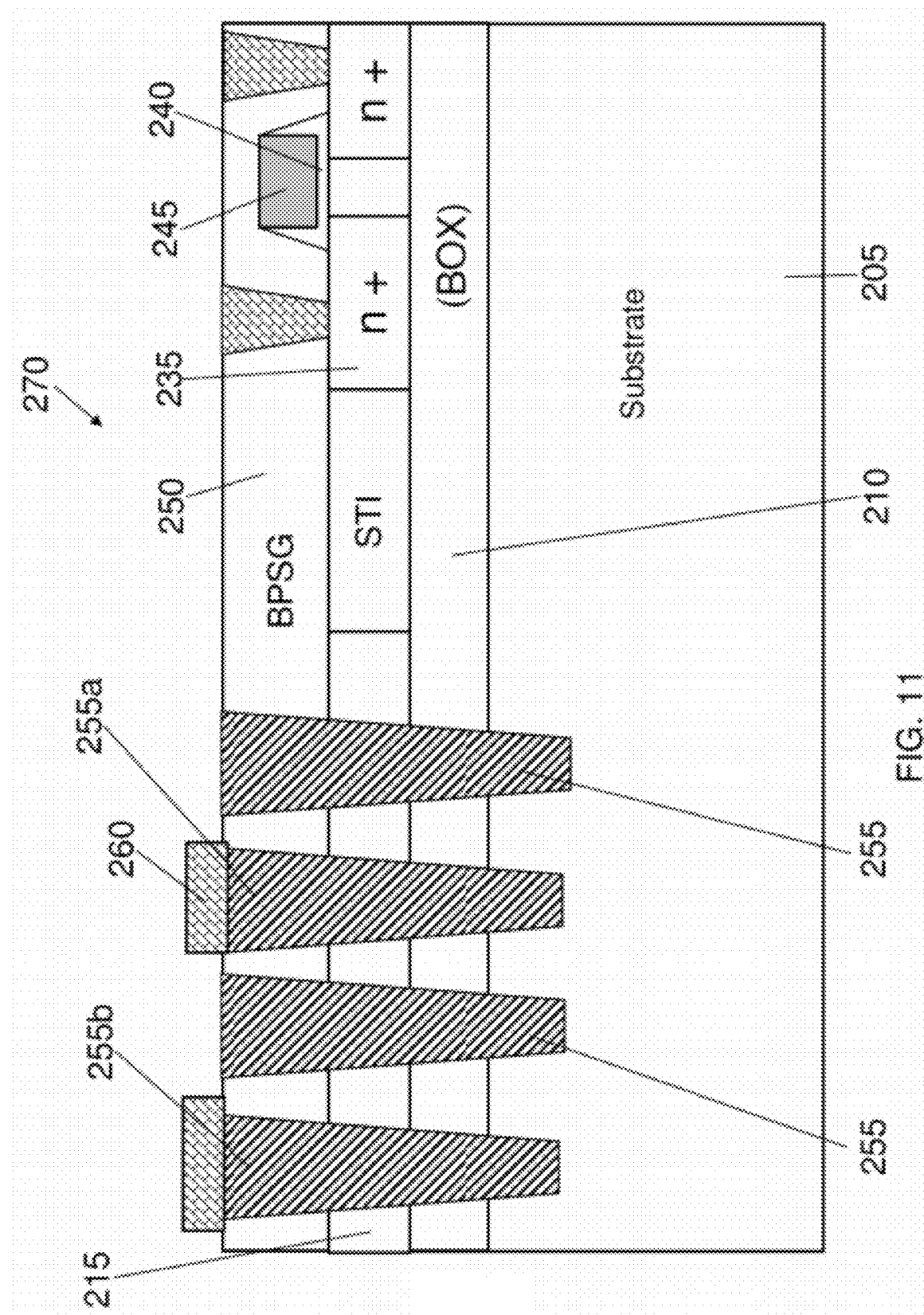
FIG. 11 shows final process steps and a structure in accordance with a second aspect of the invention.

FIGS. 6-10 show process steps for forming an exemplary integrated circuit device containing metal deep trench buried inductors shown in FIG. 11, according to a further embodiment of the invention. As shown in FIG. 6, a SOI substrate includes a silicon layer 215 formed on a buried oxide (BOX) layer 210. Additionally, the BOX layer 210 is conventionally formed on or within an Si substrate 205. The Si substrate 205 is doped very low, e.g., with a P-type dopant, e.g., $BF_2$, to impart high resistivity to the Si substrate 205. For example, the dosage of the dopant may be on the order of approximately 5e12-5e15 $cm^{-3}$.

Figure 7:
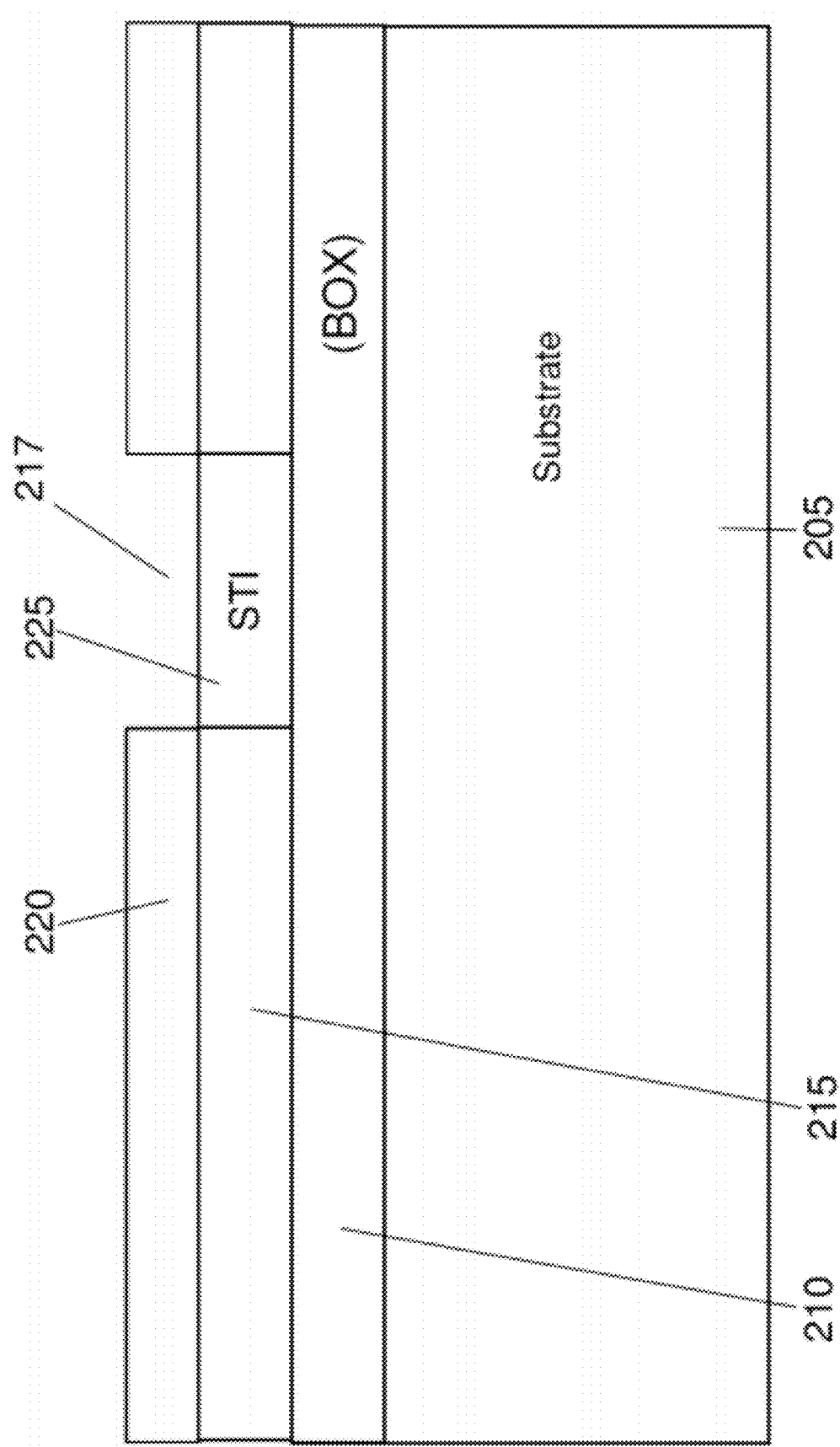

As shown in FIG. 7, a photomask layer 220 is formed on the silicon layer 215 having a window 217 formed in a selective area. The exposed area may be etched to form a shallow trench according to conventional lithography and etching processes. A shallow trench isolation (STI) 225 is formed in the shallow trench through a conventional deposition process, for example, an oxidation process and subsequent deposition of a dielectric, e.g., $SiO_2$, and a conventional planarization process.

Figure 8:
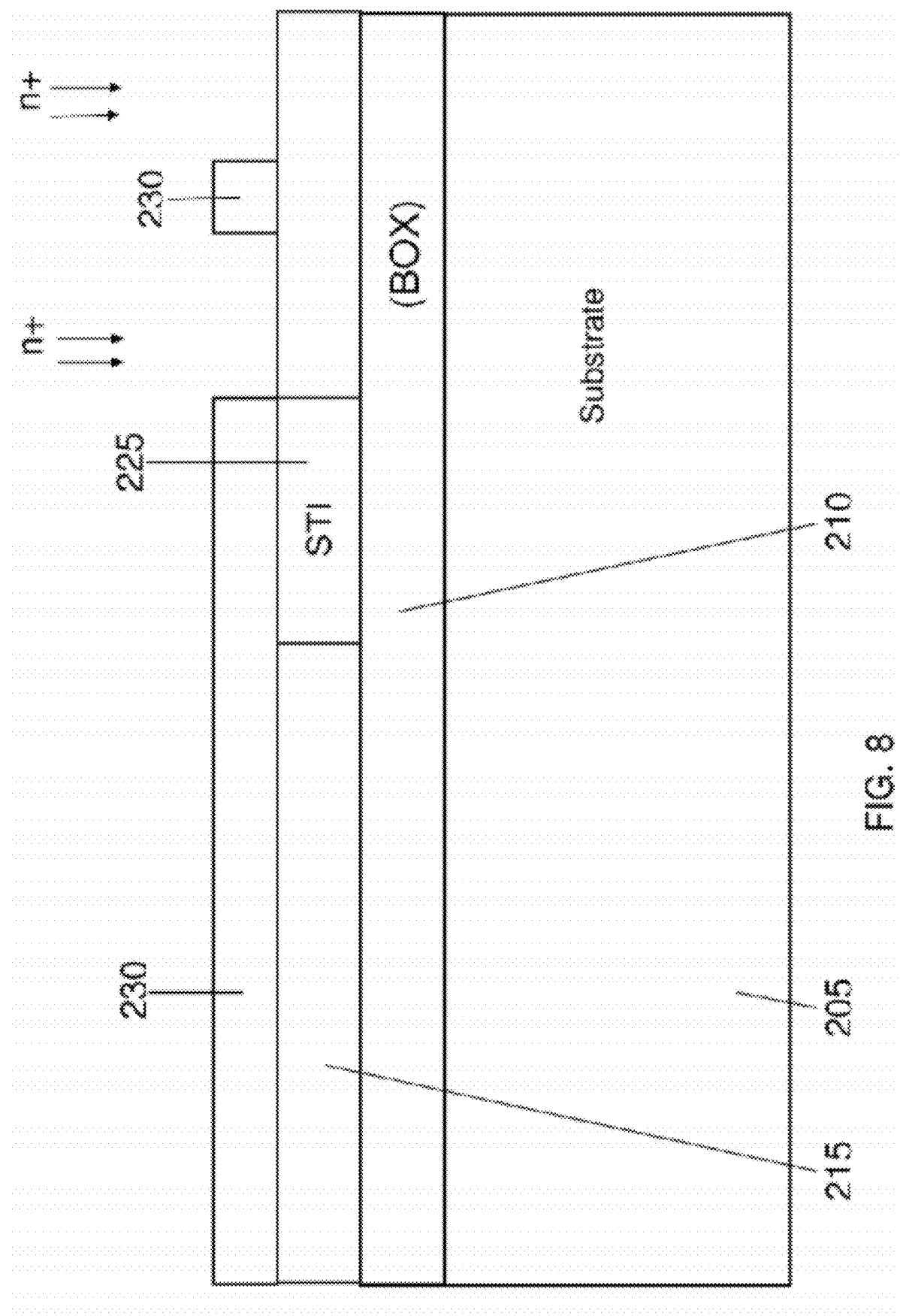

As shown in FIG. 8, the masking layer 220 is removed and a masking layer 230 is deposited according to a conventional process. Openings are formed in the masking layer 230 to expose regions of the silicon layer 215. The exposed regions may be doped, for example, with an N-type dopant, e.g., $BF_2$, to form source and drain regions in the silicon layer 215 in a conventional manner.

As shown in FIG. 9, the masking layer 230 may be removed and source and drain regions 235 may be formed in the silicon layer 215. Additionally, a gate dielectric layer 240, e.g., a gate oxide, a gate 245 and sidewalls 248 are formed in a conventional manner, e.g., a conventional photolithography process and a conventional doping process.

As shown in FIG. 10, a BPSG layer 250 may be deposited on the Si layer 215 and above the gate 245 and planarized in a conventional manner. As such, a description of the BPSG layer 250 formation and the planarization process are not necessary for a person of ordinary skill in the art to practice these particular steps.

As shown in FIG. 11, material for buried inductors 255 may be deposited in trenches formed in the substrate. The trenches may be formed through a conventional photolithography process and a conventional etch process, e.g., a reactive ion etch (RIE). The depth of the trenches may be as deep as possible into the substrate 205 to maximize the surface area of the buried inductors, and thus maximizing the inductance of the buried inductors. As is understood by one of skill in the art, the depth of the etch may be limited by the masking material used.

Additionally, as shown in FIG. 11, the buried inductors 255 may be formed by depositing a metal, e.g., tungsten, in the trenches and planarizing the metal using a conventional polishing process. Further, contacts 260 may be formed in contact with the inner end 255a and on the outer end 255b of the buried inductor 255 in a conventional manner. As such, a description of the deposition, planarization and contact formation steps are not necessary for a person of ordinary skill in the art to practice these particular steps.

According to the embodiment shown in FIG. 11, the buried inductor 255 is formed in a BEOL process. As such, a metal, e.g., tungsten, may be used to form the buried inductor, as the hot processing (e.g., for the gate formation) has already occurred. By using a metal to form the buried inductor 255, a buried inductor 255 having a higher inductance (or Q value) may be obtained.

Figure 12:
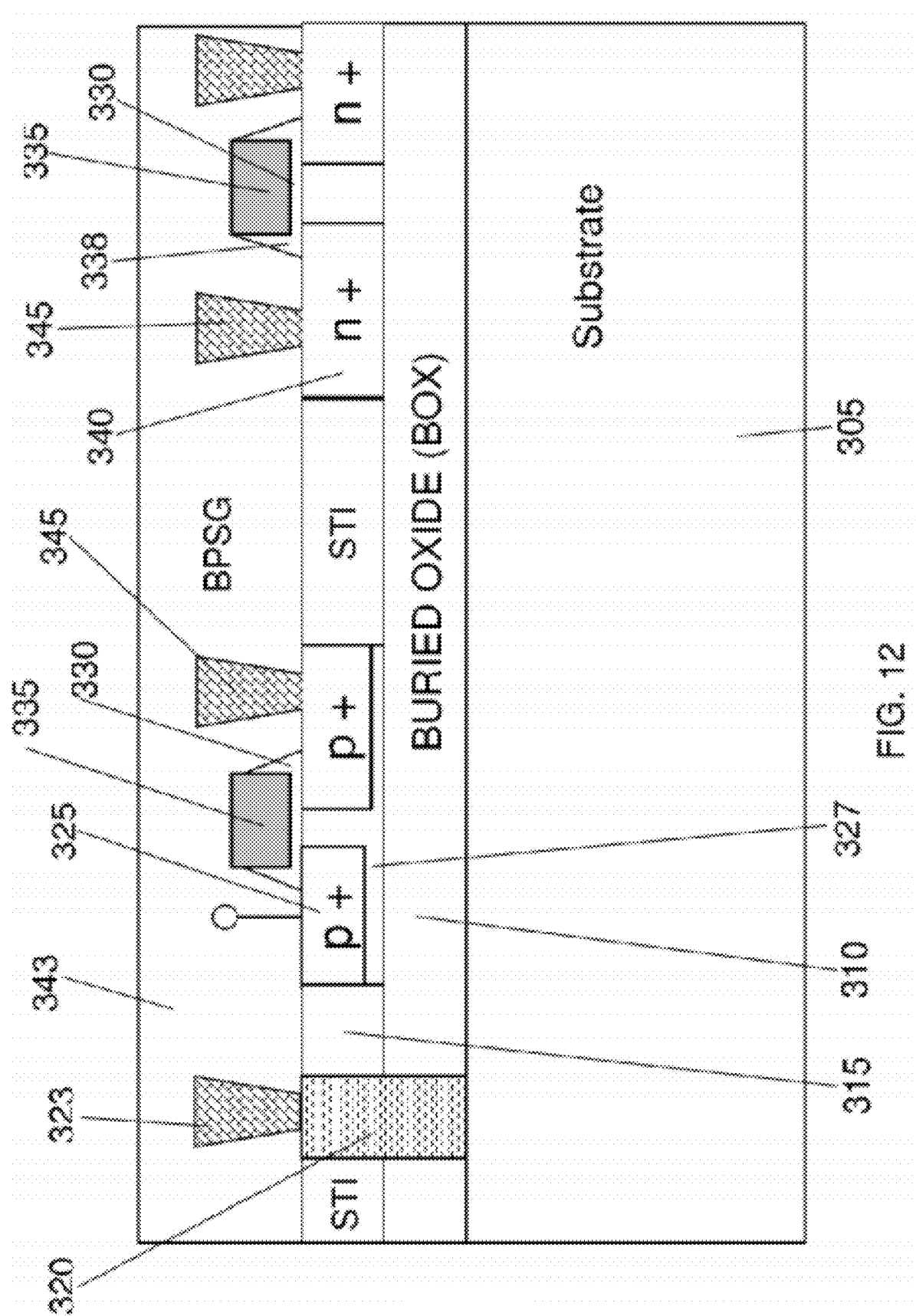
FIG. 12 shows intermediate process steps and structures in accordance with a third aspect of the invention.
Figure 13:
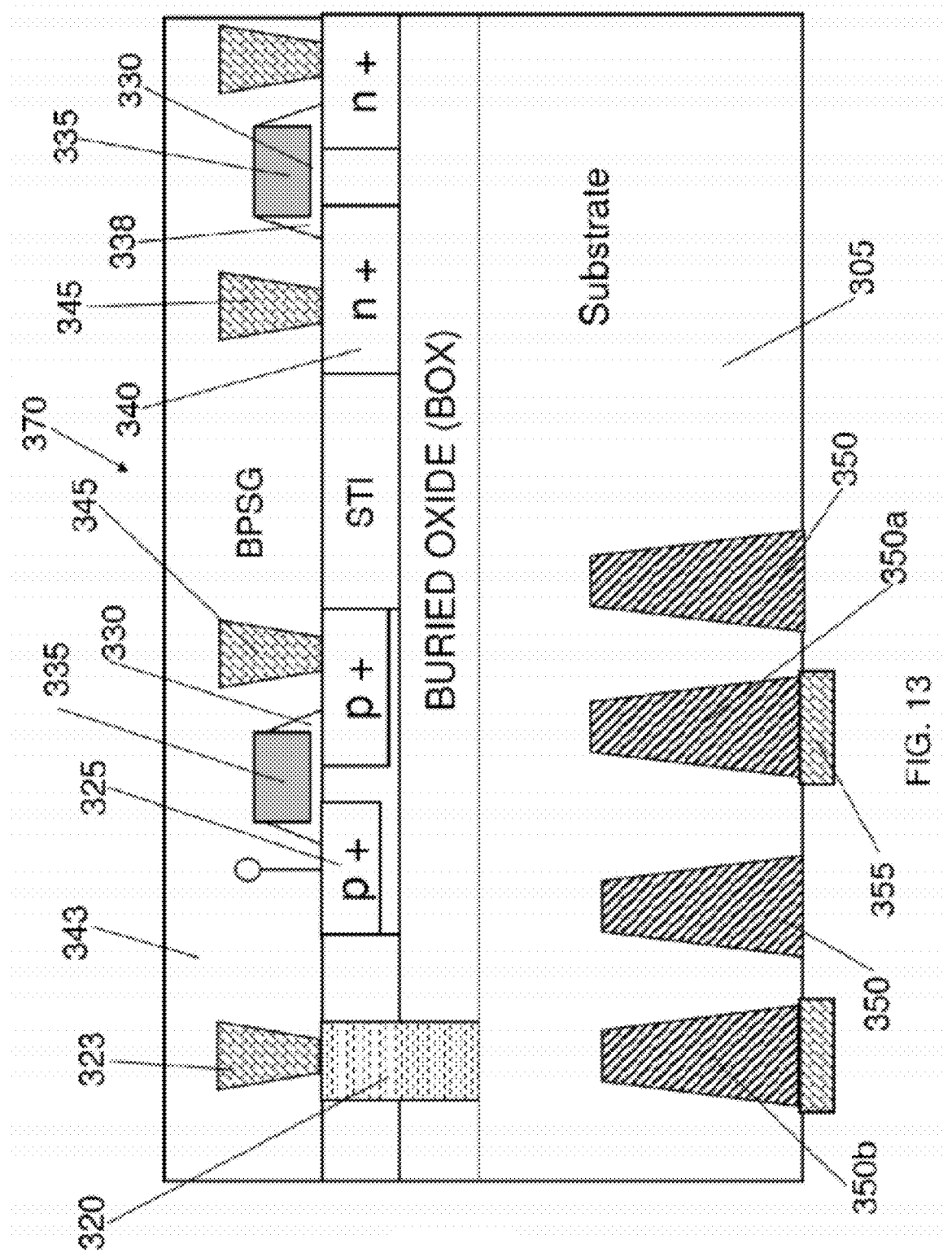
FIG. 13 shows final process steps and a structure in accordance with a third aspect of the invention.

FIGS. 12-13 show process steps for forming an exemplary integrated circuit device containing deep trench buried inductors according to a further aspect of the invention. As shown in FIG. 12, a structure includes an SOI substrate formed by the silicon layer 315, the BOX layer 310 and the substrate 305. An N-well 327 may be formed in a conventional manner, e.g., doping of an N-type dopant, e.g., As. A pFET comprising P+ source and drain regions 325 are formed in the N-well 327. Additionally, the pFET may include a gate dielectric 330, gate 335 and contacts 345 formed in contact with the regions 325 in a conventional manner. Additionally, an nFET comprising N+ source and drain regions 340, gate dielectric 330, gate 335, sidewalls 338 and contacts 345 may be formed in a similar manner. As such, a further description of the nFET and pFET formation and contact formation steps are not necessary for a person of ordinary skill in the art to practice these particular steps.

Additionally, as shown in FIG. 12, a handle wafer 320 may be formed to control voltage. The handle wafer 320 may be formed through conventional photolithography, etching, deposition and planarization processes. As such, a description of the photolithography, etching, deposition, and planarization processes are not necessary for a person of ordinary skill in the art to practice these particular steps. A contact 323 may be formed on and in contact with the handle wafer 320 in a conventional manner. As such, a description of the contact formation step is not necessary for a person of ordinary skill in the art to practice this particular step. In embodiments, the contact 323 may be used to control voltage.

As shown in FIG. 12, a BPSG layer 343 may be deposited over the device structure and planarized using a conventional polishing process. As such, a description of the BPSG layer 343 formation step is not necessary for a person of ordinary skill the art to practice this particular step. According to an aspect of the invention, the BPSG layer 343 protects the device structure, e.g., the nFET and pFET, during further processing steps described below.

FIG. 13 shows a final structure 370 after further processing steps. According to the invention, the structure of FIG. 12 may be flipped over and buried inductors may be formed on a bottom side of the structure. Forming the buried inductors on the bottom of the structure allows for more flexibility in positioning the buried inductors, as they may not interfere with the device structures on the top of the structure 370 and may be positioned with less concern for space and/or alignment issues.

The buried inductors 350 may be formed by depositing a doped polysilicon or a metal, e.g., tungsten, in the trenches formed in the substrate. As the hot processing has already occurred, (e.g., in forming the gate structures 335, in embodiments, it may be beneficial to utilize a metal in forming the buried inductor, thus obtaining a buried inductor having a higher inductance (Q value).

Contacts 355 may be formed on and in contact with the inner end 350a of the buried inductor 350 and the outer end 350b of the buried inductor 350 to provide contact to the buried inductor 350. The contacts 355 may be formed in a conventional manner.

Figure 14:
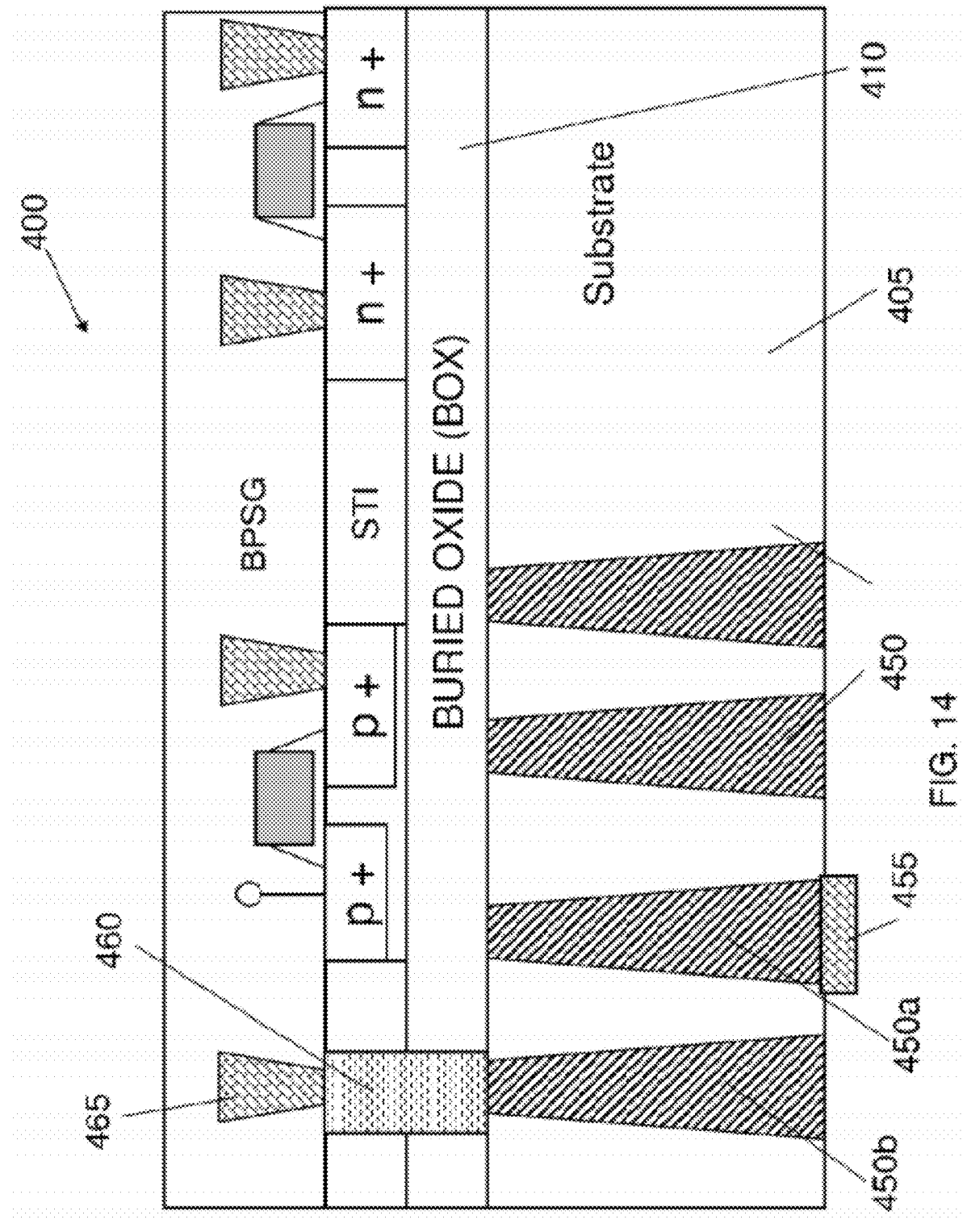
FIG. 14 shows a final structure in accordance with a fourth embodiment of the invention.

FIG. 14 shows a final structure 400 according to a further embodiment of the invention. As shown in FIG. 14, (beginning with the structure shown in FIG. 12) through-wafer buried inductors may be formed by etching trenches completely through the substrate 405 to the BOX layer 410. The buried inductors 450 may be formed in the trenches by a conventional deposition process. In embodiments, the buried inductors 450 may be formed of a doped polysilicon or a metal, e.g., tungsten. A contact 455 for the inner end 450a of the buried inductor 450 may be formed on the bottom side of the structure 400 in a conventional manner. Additionally, as shown in FIG. 14, contact may be made to the outer end 450b of the buried inductor 450 through the handle wafer 460 and contact 465 to the handle wafer. In embodiments, the through-wafer buried inductor 450 may be formed in a coil fashion. Additionally, in embodiments, prior to formation of the buried inductor 450, the trenches may be coated with a dielectric to form an isolation side wall.

Figure 15:
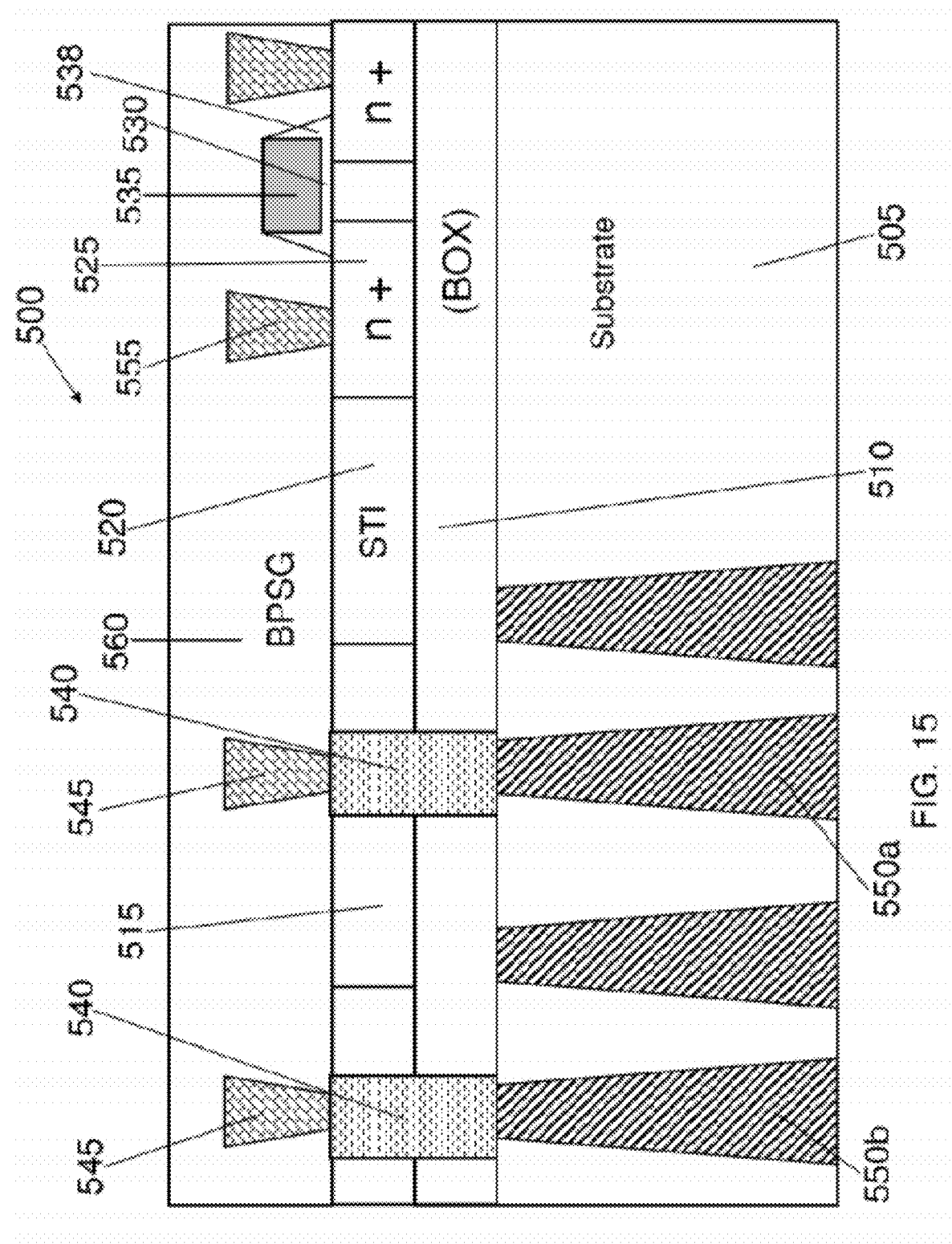
FIG. 15 shows a final structure in accordance with a fifth embodiment of the invention.

As shown in FIG. 15, through-wafer buried inductors 550 may be formed from a bottom side of the structure 500 with contacts 545 to the inner end 550a and outer end 550b of the buried inductor 550 formed on the top side of the structure 500. Thus, in a similar manner to that described in the preceding exemplary embodiments, an nFET comprising source and drain regions 525, gate dielectric 530, gate 535, sidewalls 538 and source and drain contacts 555, along with the handle wafer 540 and contacts 545 to the handle wafer may be formed in a conventional manner. Additionally, a BPSG layer 560 may be deposited and planarized over the top of the structure 500 in a conventional manner. As such, a description of the nFET formation steps, the handle wafer 540 and contact 545 formation steps and the BPSG layer 560 formation are not necessary for a person of ordinary skill in the art to practice these particular steps.

Additionally, the structure 500 may be flipped over, and trenches may be etched through the substrate 505 to the BOX layer 510 in a conventional manner, e.g., an RIE process. A buried inductor 550 may be formed in the trenches by a conventional deposition process followed by a conventional planarizing process. In embodiments, the buried inductors 550 may be formed of a doped polysilicon or a metal, e.g., tungsten.

With the embodiments shown in FIGS. 14 and 15, by utilizing the through-wafer buried inductors 550, the surface area of the buried inductors may be maximized, thus increasing inductance (or Q value) of the buried inductors. Additionally, with these embodiments, as the FEOL processing (e.g., hot processing or processing at high temperatures) has occurred prior to the etching of the trenches, the buried inductors may be formed during a BEOL process (lower temperature process). Thus, while a doped polysilicon may be used to form the buried inductor, in embodiments, it may be advantageous to utilize a metal, e.g., tungsten, thus achieving higher inductance (Q value) of the buried inductors.

Figure 16:
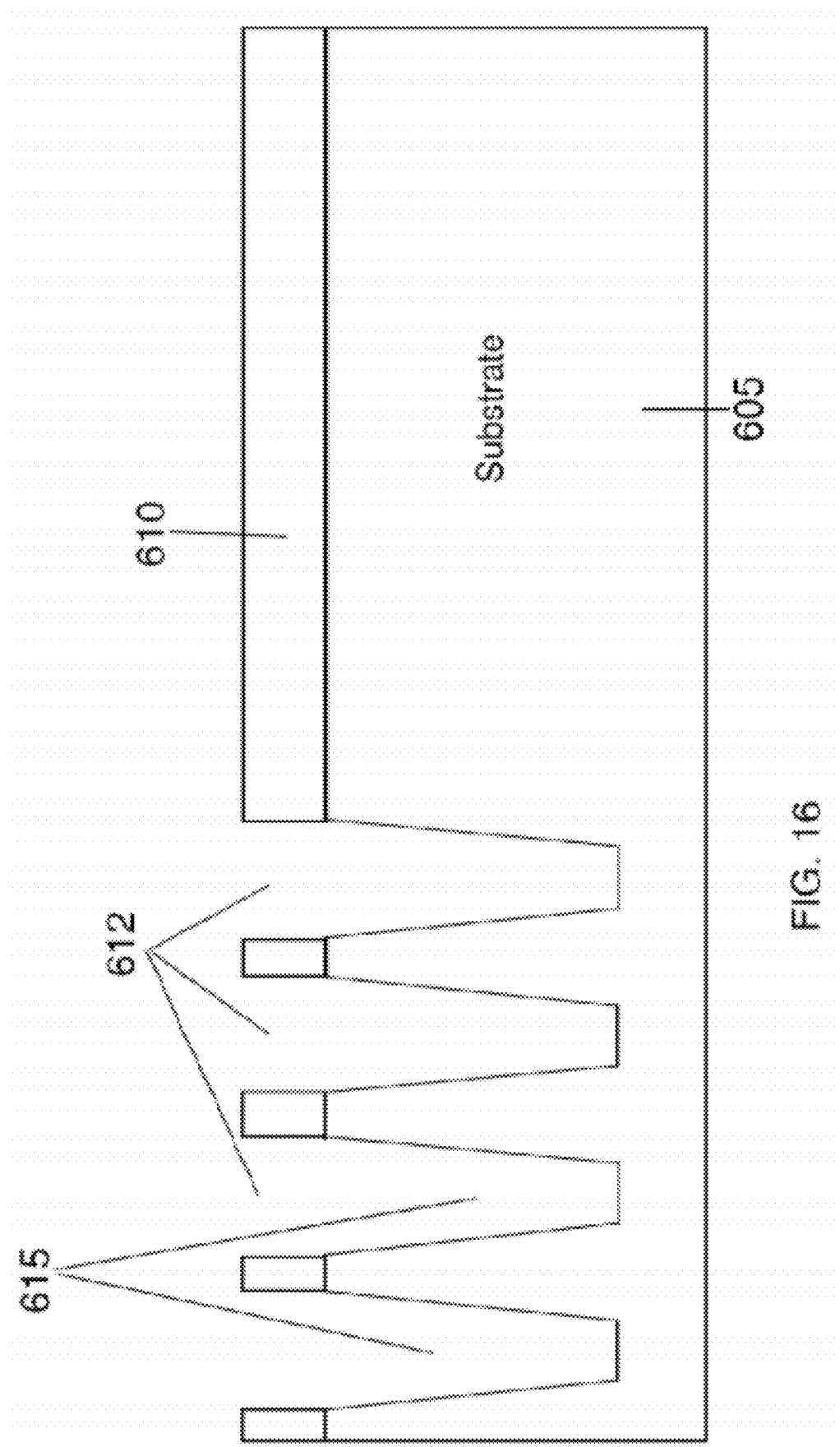
FIGS. 16-19 show intermediate process steps and structures in accordance with a sixth aspect of the invention.
Figure 18:
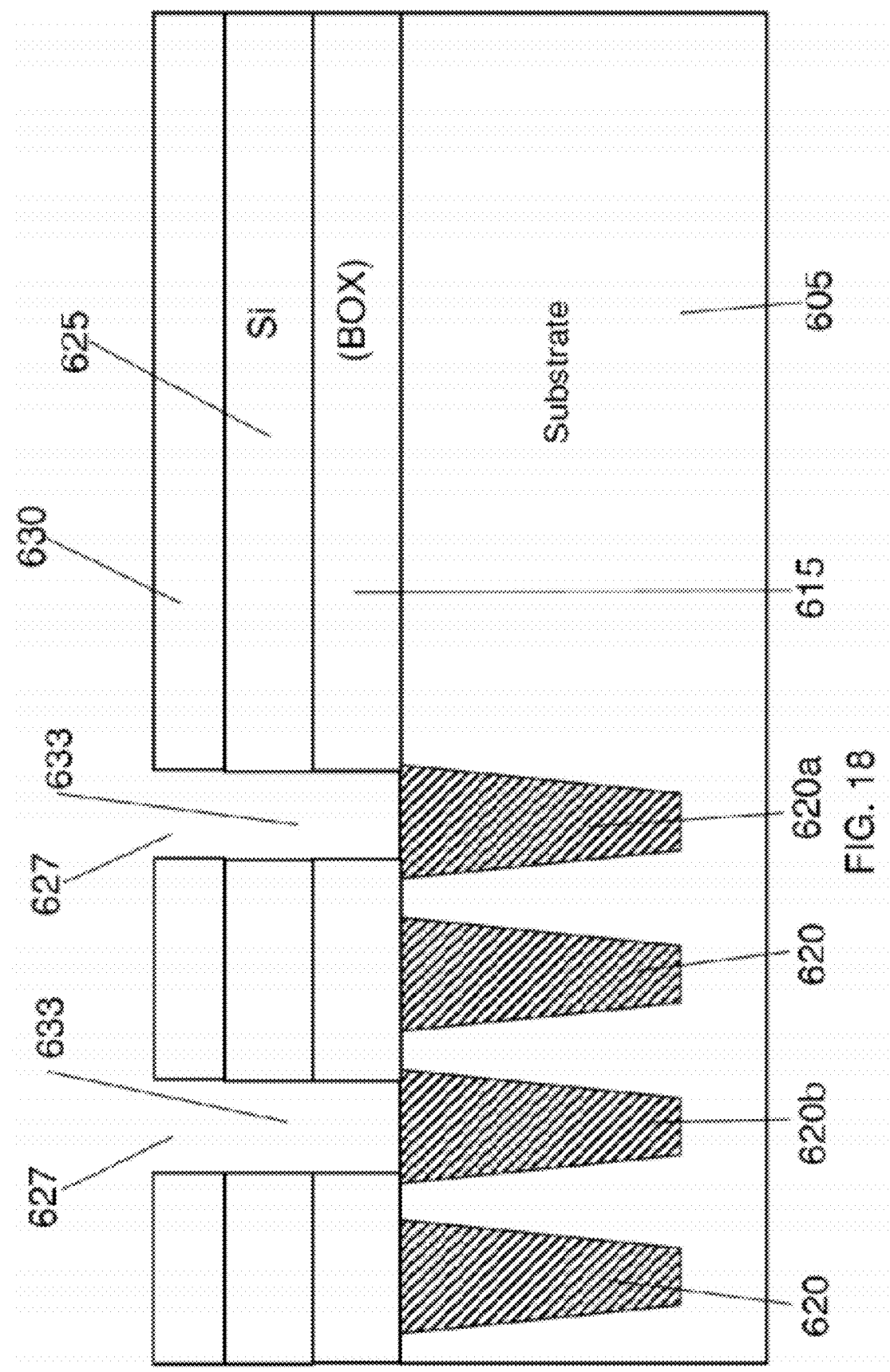
Figure 19:
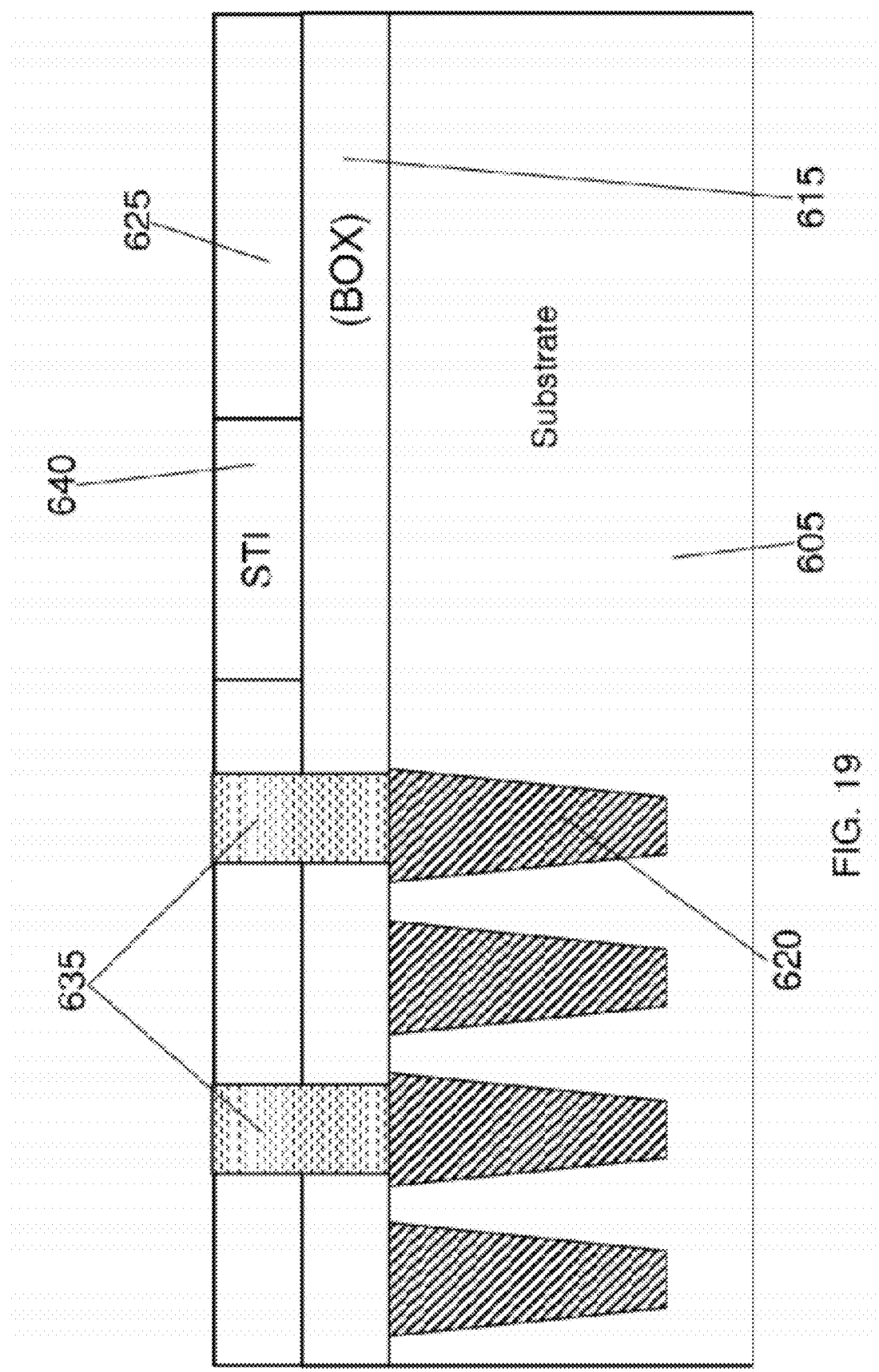
Figure 20:
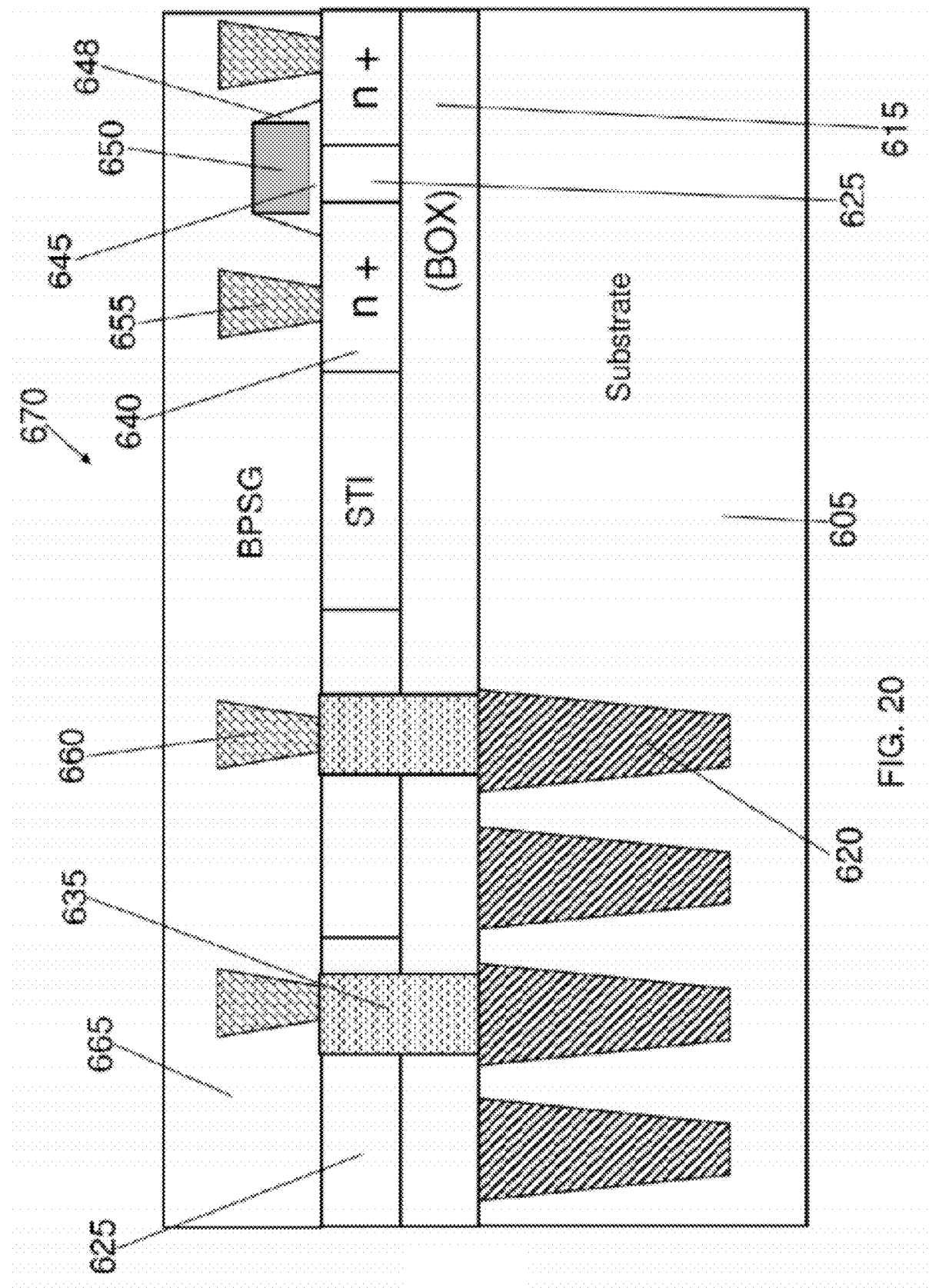
FIG. 20 shows final process steps and a structure in accordance with a sixth aspect of the invention.

FIGS. 16-19 show process steps for forming an exemplary integrated circuit device containing deep trench buried inductors shown in FIG. 20, according to a further embodiment of the invention. As shown in FIG. 16, trenches 615 may be etched in the substrate 605 prior to formation of the SOI substrate, through a conventional etching process, e.g., a RIE process. According to this exemplary embodiment, a masking layer 610 may be formed on the substrate 605 and trenches 615 may be etched through windows 612 formed in the masking layer 610 using conventional lithography and etching techniques.

Figure 17:
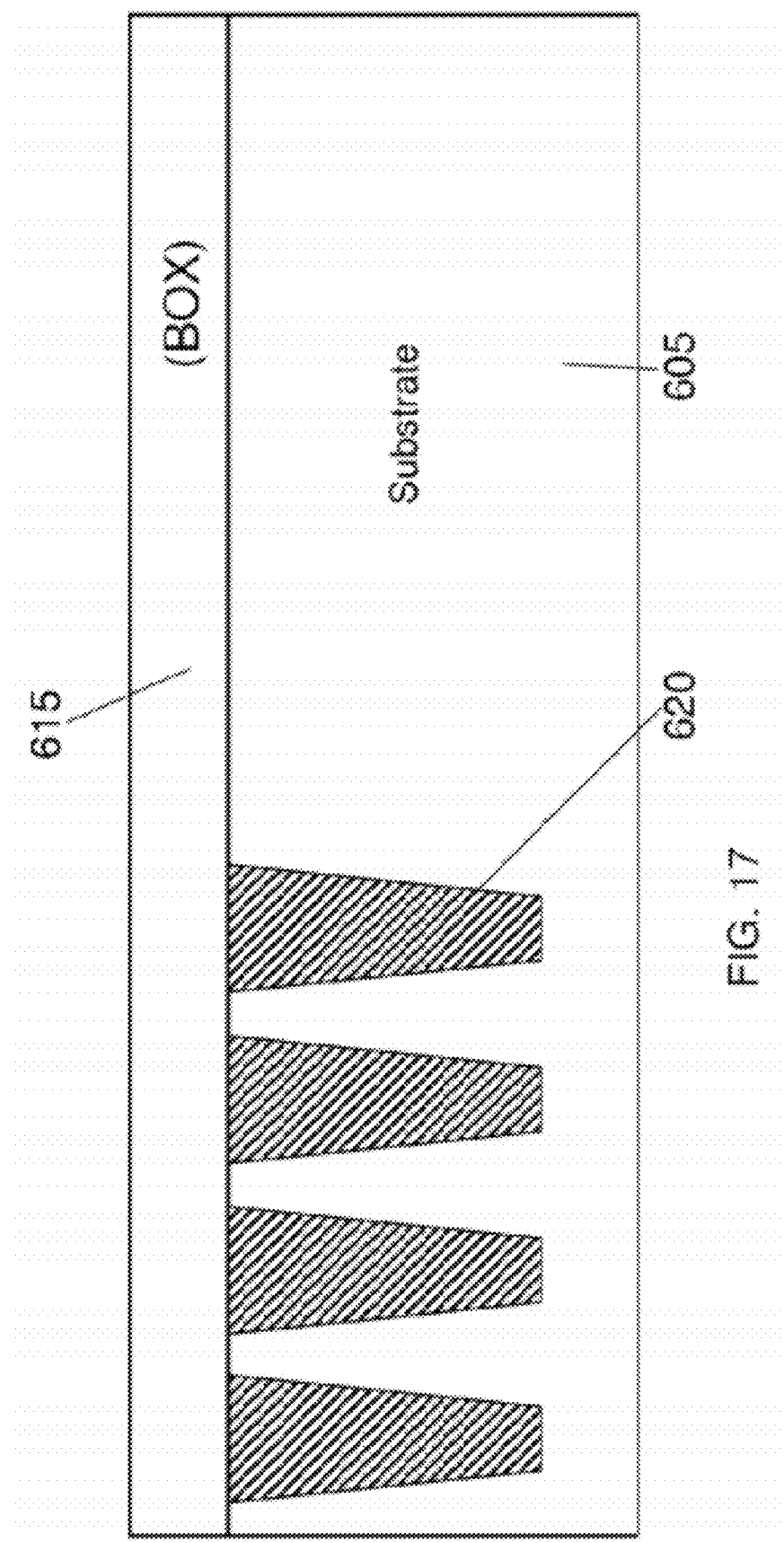

As shown in FIG. 17, a buried inductor 620 may be formed by depositing, e.g., a doped polysilicon in the trenches 615 and planarizing the deposited material using conventional deposition and polishing techniques. Additionally, as shown in FIG. 17, a BOX layer 615 may be formed by depositing an oxide on the substrate 605 in a conventional manner. Additionally, in embodiments, the SOI substrate may be formed using a smart-cut silicon process. The smart-cut silicon process is based on a hydrogen implantation and wafer bonding associated with a temperature treatment, which induces an in-depth splitting of the implanted wafer.

As shown in FIG. 18, a silicon layer 625 may be deposited on the BOX layer 615. Additionally, a masking layer 630 with openings 627 may be formed on the silicon layer 625 using a conventional deposition and lithography process. As shown in FIG. 18, the openings 627 may be aligned with the inner end 620a of the buried inductor 620 and the outer end 620b of the buried inductor 620. Trenches 633 may be etched through the silicon layer 625 and the BOX layer 615 using a conventional etching process, e.g., an RIE process.

As shown in FIG. 19, the masking layer 630 has been removed. Additionally, a conductive material 635 may be deposited in the trenches to contact the inside loop 620a and the outside loop 620b of the buried inductors. Additionally, a shallow trench isolation (STI) 640 may be formed in the silicon layer 625 using conventional lithography and etching processes.

FIG. 20 shows an exemplary final structure 670 according to a further embodiment of the invention. As shown in FIG. 20, an nFET comprising N+ source and drain regions 640, a gate dielectric 645, a gate 650, sidewalls 648 and source and drain contacts 655 may be formed in a conventional manner. Contacts 660 to the conductive material 635 may be formed in a conventional manner. Additionally, a layer of BPSG 665 may be deposited over the device in a conventional manner.

Design Flow

Figure 21:
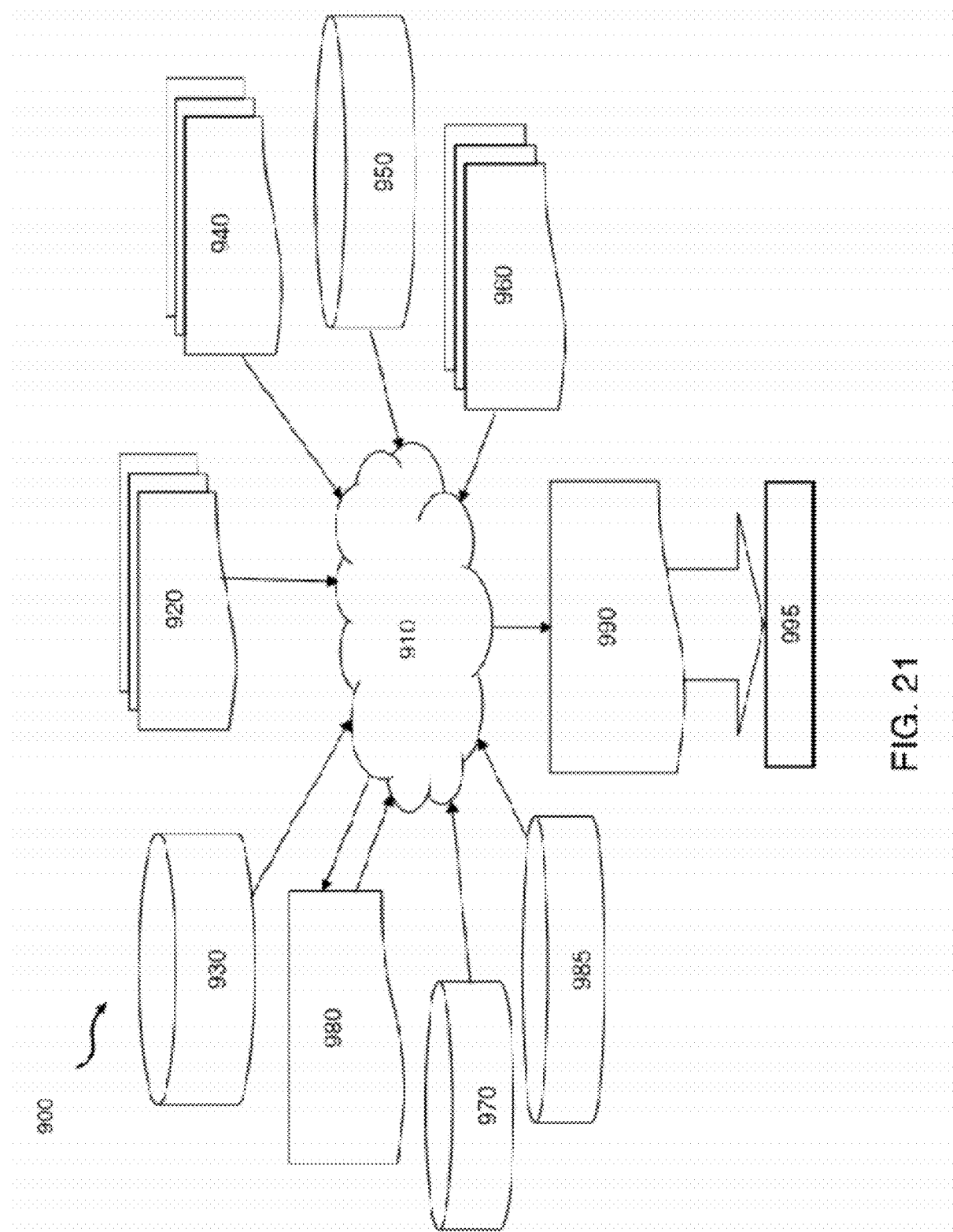
FIG. 21 is a flow diagram of a design process used in semiconductor design, manufacturing, and/or test.

FIG. 21 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. (Altera is a registered trademark of Altera Corporation in the United States, other countries, or both. Xilinx is a registered trademark of Xilinx, Inc. in the United States, other countries, or both.) Design structure 920 is preferably an input to a design process 910 and may come from an IP provider, a core developer, or other design company or may be generated by the operator of the design flow, or from other sources. Design structure 920 comprises an embodiment of the invention as shown in FIGS. 5, 11, 13, 14, 15 and 20 in the form of schematics or HDL, a hardware-description language (e.g., VERILOG®, Very High Speed Integrated Circuit (VHSIC) Hardware Description Language (VHDL), C, etc.). (VERILOG is a registered trademark of Cadence Design Systems, Inc. in the United States, other countries, or both.) Design structure 920 may be contained on one or more machine readable medium. For example, design structure 920 may be a text file or a graphical representation of an embodiment of the invention as shown in FIGS. 5, 11, 13, 14, 15 and 20. Design process 910 preferably synthesizes (or translates) an embodiment of the invention as shown in FIGS. 5, 11, 13, 14, 15 and 20 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 5, 11, 13, 14, 15 and 20, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 5, 11, 13, 14, 15 and 20. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. While the invention has been described in terms of embodiments, those skilled in the art will recognize that the invention can be practiced with modifications and in the spirit and scope of the appended claims.

What is claimed is:

1. A structure comprising:
   a high resistivity substrate; and
   a buried inductor formed directly in the high resistivity substrate and devoid of an insulating layer therebetween, wherein the high resistivity substrate comprises a silicon on insulator (SOI) substrate.

2. The structure of claim 1, wherein the high resistivity substrate comprises a very low doped silicon providing a resistance from 1K Ohm-cm to 10K Ohm-cm.

3. The structure of claim 1, wherein the buried inductor comprises a conductive coil having an inner end and an outer end, wherein at least one of the inner end and the outer end are electrically connected to a top surface of the high resistivity substrate.

4. The structure of claim 1, wherein the buried inductor comprises a conductive coil having an inner end and an outer end, wherein at least one of the inner end and the outer end are electrically connected to a bottom surface of the high resistivity substrate.

5. The structure of claim 1, wherein the buried inductor comprises:
   a trough in the high resistivity substrate; and
   a conductive fill material within the trough.

6. The structure of claim 1, wherein the buried inductor is formed through each layer of the high resistivity substrate.

7. The structure of claim 1, wherein the buried inductor is formed through a backside of the high resistivity substrate.

8. The structure of claim 1, wherein:
   the high resistivity substrate comprises a very low doped silicon providing a resistance from 1K Ohm-cm to 10K Ohm-cm and the silicon on insulator (SOI) substrate;
   the buried inductor comprises a trough in the high resistivity substrate and a conductive fill material comprising a doped polysilicon or a metal within the trough forming a conductive coil having an inner end and an outer end; and
   the inner end and the outer end are electrically connected to one of a top surface and a bottom surface of the high resistivity substrate.

9. The structure of claim 1, wherein the high resistivity substrate comprises the silicon on insulator (SOI) substrate including:
   a first semiconductor region on a top surface;
   a buried oxide region below the first semiconductor region; and
   a second semiconductor region below the buried oxide region comprising a very low doped silicon region which provides a resistance from 1K Ohm-cm to 10K Ohm-cm.

10. The structure of claim 1, wherein the high resistivity substrate comprises the silicon on insulator (SOI) substrate, and the buried inductor comprises a conductive coil having an inner end and an outer end, and further comprising:
    a shallow trench isolation (STI) region in an upper semiconductor layer of the SOI substrate;
    a transistor on the upper semiconductor layer, wherein the STI region is between the transistor and the buried inductor; and
    a layer or film on respective upper surfaces of the inner end and the outer end of the conductive coil; and
    buried inductor contacts on the layer or film.

11. The structure of claim 1, wherein the high resistivity substrate comprises the silicon on insulator (SOI) substrate, and the buried inductor comprises a conductive coil having an inner end and an outer end, and further comprising:
    a transistor on an upper semiconductor layer on a top side of the SOI substrate, wherein the buried inductor is on a bottom side of the SOI substrate;
    a contact for the inner end of the conductive coil on the top side;
    a contact for the outer end of the conductive coil on the top side; and
    a conductive material in a buried insulator layer and the upper semiconductor layer, wherein the conductive material is between and contacts the outer end of the conductive coil and the contact for the outer end of the conductive coil.

12. The structure of claim 1, wherein the high resistivity substrate comprises the silicon on insulator (SOI) substrate, and the buried inductor comprises a conductive coil having an inner end and an outer end, and further comprising:

a transistor on an upper semiconductor layer on a top side of the SOI substrate, wherein the buried inductor is on a bottom side of the SOI substrate;

a contact for the inner end of the conductive coil on the top side; and a contact for the outer end of the conductive coil on the top side or the bottom side.

13. The structure of claim 5, wherein the conductive fill material is a doped polysilicon or a metal.

14. A structure comprising:

a high resistivity substrate; and a buried inductor formed directly in the high resistivity substrate and devoid of an insulating layer therebetween, wherein the high resistivity substrate comprises:

a first semiconductor region on a top surface;

a buried oxide region below the first semiconductor region; and a second semiconductor region below the buried oxide region.

15. The structure of claim 14, wherein the buried inductor is formed within the second semiconductor region and in contact with the buried oxide region.

16. A design structure embodied in a machine readable medium for designing, manufacturing, or testing an integrated circuit, the design structure comprising:

a high resistivity substrate; and a buried inductor formed directly in the high resistivity substrate and devoid of an insulating layer therebetween, wherein the high resistivity substrate comprises a first semiconductor region, an oxide layer, and a second semiconductor region.

17. The design structure of claim 16, wherein the design structure comprises a netlist.

18. The design structure of claim 16, wherein the design structure resides on storage medium as a data format used for the exchange of layout data of integrated circuits.

19. The design structure of claim 16, wherein the design structure resides in a programmable gate array.

20. The design structure of claim 16, wherein:

the second semiconductor region comprises a silicon substrate;

the oxide layer is on the silicon substrate; and the first semiconductor region comprises a silicon layer on the oxide layer.

\* \* \* \* \*